United States Patent

Jurisch et al.

[11] Patent Number: 6,034,592
[45] Date of Patent: Mar. 7, 2000

[54] PROCESS FOR PRODUCING SIGNALS IDENTIFYING FAULTY LOOPS IN A POLYPHASE ELECTRICAL POWER SUPPLY NETWORK

[75] Inventors: Andreas Jurisch; Matthias Kereit, both of Berlin, Germany

[73] Assignee: Siemens AG, Munich, Germany

[21] Appl. No.: 09/077,336

[22] PCT Filed: Nov. 22, 1996

[86] PCT No.: PCT/DE96/02281

§ 371 Date: Nov. 13, 1998

§ 102(e) Date: Nov. 13, 1998

[87] PCT Pub. No.: WO97/20219

PCT Pub. Date: Jun. 5, 1997

[30] Foreign Application Priority Data

Nov. 27, 1995 [DE] Germany .................. 195 45 267

[51] Int. Cl.$^7$ .................................................. H04M 11/04
[52] U.S. Cl. .............................. 340/310.05; 340/310.01; 340/538; 324/509; 324/521
[58] Field of Search .................... 340/506, 507, 340/508, 509, 511, 514, 519, 523, 538, 635, 657, 658, 825.06, 310.01; 324/107, 512, 500, 509, 510, 521

[56] References Cited

U.S. PATENT DOCUMENTS

| 3,612,989 | 10/1971 | Souillard et al. ............... 324/522 |
| 3,800,215 | 3/1974 | Souillard et al. ............... 324/522 |
| 5,349,644 | 9/1994 | Massey et al. ............. 340/310.06 X |

FOREIGN PATENT DOCUMENTS

| 0 227 017 | 7/1987 | European Pat. Off. . |
| 0 665 625 | 8/1995 | European Pat. Off. . |
| 2 036 391 | 12/1970 | France . |
| 2 590 992 | 5/1987 | France . |

OTHER PUBLICATIONS

Siemens Aktiengesellschaft, "*Digitaler Abzweigschutz*" 7SA511 V3.0, Order No. C53000–G1100–C98–1, 1995 on p. 36.

R. Roeper, "*Kurzschlussströme in Drehstromnetzen*", 6th edition, 1984, pp. 48 to 53.

AEG Akiengesellschaft, "*Distanzschutzeinrichtung*", PD 551, Firmendruckschrift Nr. A232.06.04052/1093, 1993.

Primary Examiner—Daryl Pope
Attorney, Agent, or Firm—Kenyon & Kenyon

[57] ABSTRACT

A method for producing signals indicating faulty loops in a polyphase electrical power supply network using impedance excitation, in which, after checking for ground faults, by comparing the amounts of the impedance values obtained during the impedance excitation, the signals indicating the faulty loops are formed. In order to eliminate with great certainty all the loops that are actually not faulty, in spite of initial excitation, in ascertaining loops which are exclusively free of ground faults, the actually faulty loops are determined by comparing calculated, virtual impedances, to impedances measured during the impedance excitation; in ascertaining at least one loop having ground faults, fault-free phase-to-ground loops are recognized and eliminated by comparing the amounts of the virtual impedance values, formed with respect to the phase-to-ground loops detected as faulty, to the smallest virtual impedance value, and fault-free phase-to-ground loops are recognized and eliminated. For further processing of the impedance values of the remaining loops ascertained as faulty and not eliminated, testing methods are used which are developed differently in light of the number of phase-to-ground loops determined simultaneously.

8 Claims, 7 Drawing Sheets

PROCESS FOR PRODUCING SIGNALS IDENTIFYING FAULTY LOOPS IN A POLYPHASE ELECTRICAL POWER SUPPLY NETWORK

FIELD OF THE INVENTION

The present invention relates to a method for producing signals indicating faulty loops in a polyphase electrical power supply network using impedance excitation.

BACKGROUND INFORMATION

A known method of indicating faulty loops is described in the Siemens instruction manual "Digitaler Abzweigschutz" (Digital Feeder Protection) 7SA511 V3.0, Order No. C53000-G1100-C98-1, 1995 on page 36. In this conventional method, an impedance excitation is carried out in the form of a loop-related excitation process. It this context, after carrying out a first method step for detecting ground faults, the phase-to-ground loops are monitored in the event of at least one detected ground fault, and the phase-to-phase loops are monitored if there are no detected ground faults. A loop is considered as excited if the corresponding ascertained impedance indicator lies within the excitation polygon effective for the respective loop. If a plurality of loops are excited simultaneously, the impedances are compared, during which only those loops are classified as excited whose impedance is not more than 1.5-fold the smallest loop impedance.

SUMMARY OF THE INVENTION

An object of the invention is to provide a method for producing signals indicating faulty loops in a polyphase electrical power supply network, in which, with great reliability, all the loops are eliminated that are actually not faulty, in spite of initial excitation, so that only the loops which are actually affected by an error are checked by, for instance, an allocated distance impedance protection. To achieve this objective, according to the present invention, in ascertaining loops which are exclusively free of ground faults by comparing, according to amount and phase, virtual impedances calculated with regard to the detected phase-to-phase loops, to the impedances ascertained during the impedance excitation, the actually faulty loops are determined; and in ascertaining at least one loop having ground faults, by comparing the amounts of virtual impedance values formed from the impedance values of the phase-to-ground loops detected as faulty, to the smallest virtual impedance value, fault-free phase-to-ground loops are recognized and eliminated;

for further processing of the impedance values of the remaining loops detected as faulty and not eliminated, differently developed testing methods are used in light of the number of phase-to-ground loops detected simultaneously, in each case that testing method of said testing methods being run through which corresponds to the respective number of phase-to-ground loops determined.

An advantage of the method of the present invention is that, to eliminate apparent impedance excitations, tests are conducted in succession according to various criteria, the subsequent test in each case being dependent on the result of the respective previous test, so that, focusing on the goal, only the actually fault-free loops are eliminated in each case. Another advantage is that loops mistakenly excited, (i.e, fault-free), can be separated out relatively reliably using the method of the present invention. This can be attributed to the use of virtual impedances, for whose calculation, one falls back only upon one of the currents utilized for determining the loop impedance, it being assumed that the other current has the same amplitude and is shifted by 180° in phase compared to the utilized current. The use of virtual impedances avoids the disadvantages of using positive phase-sequence system impedances according to the theory of symmetrical components, because in certain fault cases, the positive phase-sequence system impedance of a faulty loop can be greater than the positive phase-sequence system impedance of a fault-free loop. Reference is made to the book by R. Roeper, "Kurzschlußströme in Drehstromnetzen", (Short-Circuit Currents In Three-Phase Systems) 6th edition, 1984, pages 48 to 53 for the definition of positive phase-sequence system impedances.

With a view to a very reliable and goal-focused elimination of excited, but actually fault-free loops, in the method of the present invention, it has proven to be advantageous if, in the case of a single detected phase-to-ground loop, the testing method is conducted in the manner that, by comparing the impedance values of all detected phase-to-phase loops to a predefined multiple of the impedance value of the phase-to-ground loop, those phase-to-phase loops are eliminated whose impedance values lie above a predefined multiple of the impedance value of the phase-to-ground loop, and subsequently, by comparing the phase angles of the impedance values of the non-eliminated phase-to-phase loops and of the phase-to-ground loop, as well as by comparing the impedance values of these loops to one another, a not yet eliminated phase-to-phase loop, or the phase-to-ground loop is eliminated, in the case of an eliminated phase-to-ground loop, an additional testing process being conducted with respect to this loop.

To obtain more reliable work results, it has proven to be advantageous if, before comparing the impedance values of all detected phase-to-phase loops, a check is made as to whether the amount of the respective impedance is greater than a predefined threshold value. This ensures that the determination of the phase angles having sufficiently large impedances is carried out, so that measuring errors are ruled out to a great extent.

To be able to recognize and eliminate fault-free loops with great reliability in the case of two phase-to-ground loops established as faulty during the excitation as well, in one advantageous refinement of the method according to the present invention, given two ascertained phase-to-ground loops, the phase difference between the impedances of the two phase-to-ground loops is examined as to whether it lies above a predefined limiting angle and, in response to a phase difference lying above this limiting angle, by comparing the phase angles of the impedances of the phase-to ground loops, to the phase angle of a zero-sequence impedance, the phase-to-ground loop having the greatest phase difference with respect to the zero-reference impedance is eliminated; by comparing the impedance values of the detected phase-to-phase loops, to the smallest impedance value of the phase-to-ground loops, those phase-to-phase loops are eliminated whose impedance values lie above a predefined multiple of the smallest impedance value, and subsequently, by comparing the phase angles of the impedance values of the non-eliminated phase-to-phase loop and of the phase-to-ground loop, as well as by comparing the impedance values of these loops to one another, a not yet eliminated phase-to-phase loop or the phase-to-ground loop is eliminated, in the event of an eliminated phase-to-ground loop, the additional testing process being conducted with respect to this loop.

In order to achieve even more reliability, it has also proven to be advantageous in this refinement of the method according to the present invention if, before checking the phase difference, a check is made as to whether the amount of the phase-to-ground loops is greater in each case than a predefined threshold value.

Both when ascertaining actually faulty loops in the case of a single phase-to-ground loop initially determined as faulty, and in the case of two phase-to-ground loops initially recognized as faulty, positive phase-sequence system impedances calculated according to the theory of symmetrical components are advantageously used to compare the impedance values of the detected phase-to-phase loops.

In the course of implementing the method of the present invention, in the case of one or two phase-to-ground loops initially determined as faulty, it is possible to ascertain with reliability which of the two not yet eliminated conductor loops is actually faulty, according to one further advantageous refinement of the method according to the present invention, given a phase angle resulting in each case during the comparison of the phase angles and having a size lying above a further predefined limiting angle, the amounts of the impedances of the two respective loops are compared to one another; if the amount of the impedance of the phase-to-phase loop is greater than that of the phase-to-ground loop, the phase-to-phase loop is eliminated, while given a different magnitude ratio, the phase-to-ground loop is only eliminated when, in the additional testing process, the value of the impedance of the phase-to-phase loop is less than the value of the positive phase-sequence system impedance of this loop calculated according to the theory of symmetrical components.

In another additional refinement of the method of the present invention, in the case of three phase-to-ground loops established as faulty, the actually faulty phase-to-ground loops are advantageously determined by comparing, according to amount and phase, virtual impedances calculated with respect to the conductor detected as faulty, to the impedances determined during the impedance excitation.

Figure 1:
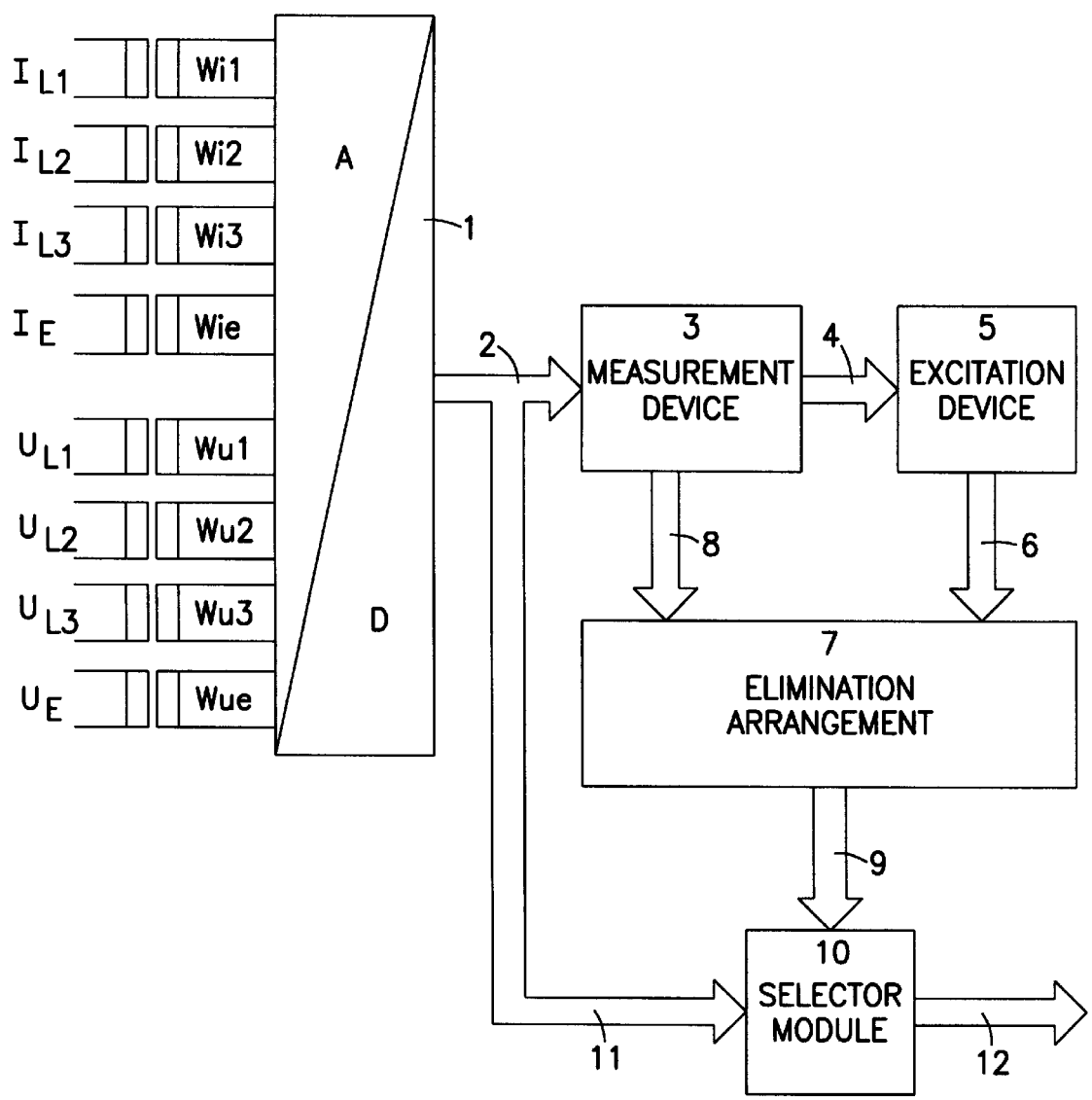
FIG. 1 shows a block diagram of an exemplary arrangement for implement the method according to the present invention.

As shown in from FIG. 1, currents $I_{L1}$ to $I_{L3}$ are fed in conductors of a polyphase power supply network (not shown) via transformers Wi1, Wi2 and Wi3 to an analog-digital converter 1. In addition, a current quantity proportional to the ground current in the power supply network is fed via an additional current transformer Wie into analog-digital converter 1. Furthermore, voltages $U_{L1}$ to $U_{L3}$ that are obtained via voltage transformers Wu1 to Wu3 and are proportional to the voltages at the conductors of the polyphase power supply network, are applied to the incoming side of analog-digital converter 1; an additional voltage $U_E$ is diverted, via an additional voltage transformer Wue, from the phase-to-earth voltage at the polyphase power supply network.

Digital values, formed by analog-digital converter 1 from the input variables indicated, are fed via a data bus 2 to a device 3 for impedance measurement. Arranged downstream of this device 3, via another data bus 4, is an excitation device 5, with which it is determined, in a manner described more precisely below, whether impedance values are formed in device 3 that, based on a comparison to an excitation polygon, indicate a faulty loop.

On the output side, excitation device 5 is connected via a further data bus 6 to an arrangement 7 for eliminating apparent excitations and to which, via an additional data bus 8, are also fed measured values that are allocated to the excited loops transmitted via data bus 6. Eliminated in arrangement 7 are the loops which are actually fault-free based on a check test made in this arrangement, so that only the loops that are actually faulty are transmitted via a data bus 9 to a selector module 10. The measured impedance values, fed via a data bus 11, are allocated in selector module 10 to these actually faulty loops, so that a distance-protection measuring device, not shown in FIG. 1, that is connected to another data bus 12, performs a distance measurement for the loops actually recognized as faulty, and, if indicated, gives off a tripping command to an allocated power circuit-breaker (not shown) in the polyphase power supply network to be monitored.

Figure 2:
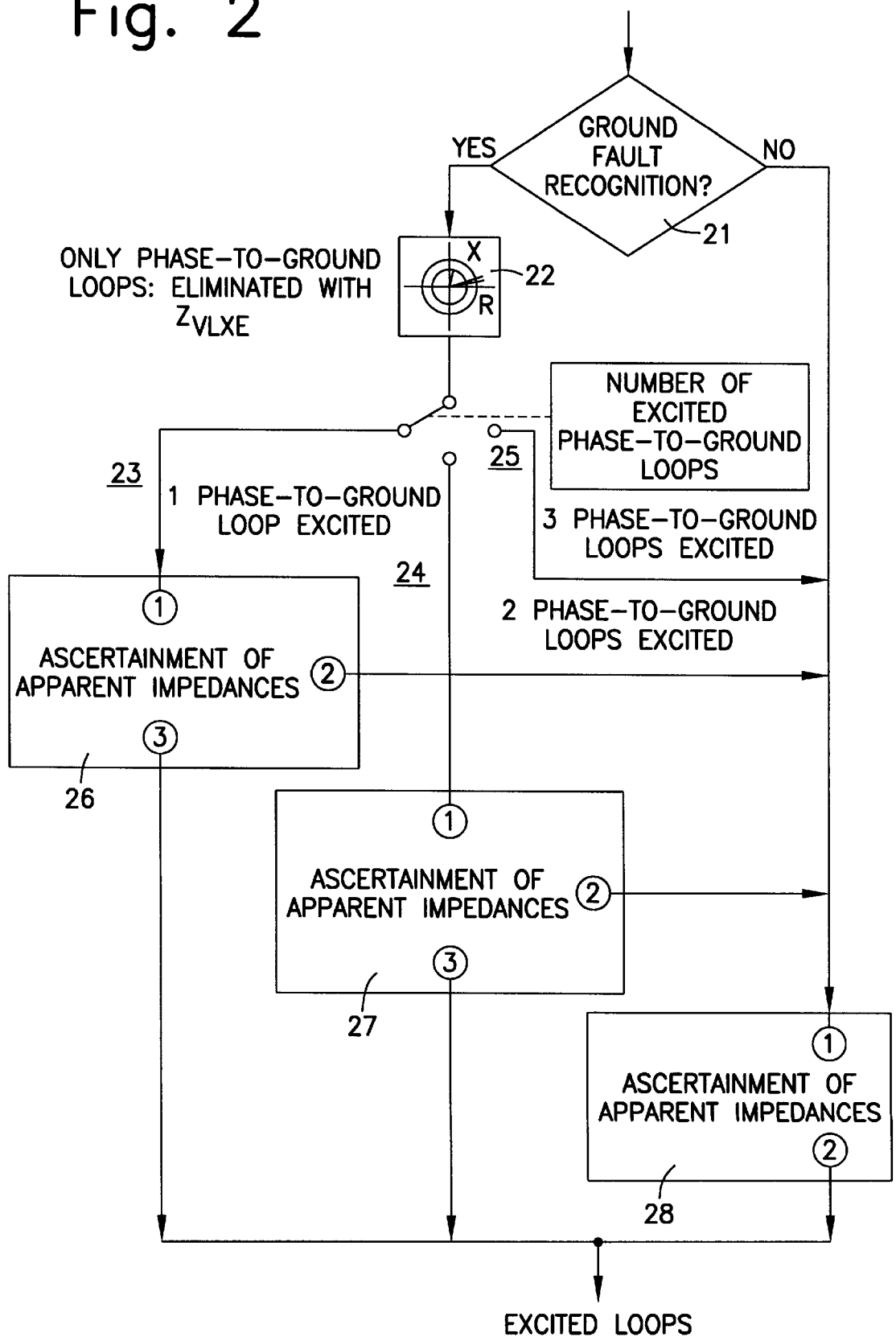
FIG. 2 shows a flow chart depicting an overall view of the sequence of an exemplary embodiment of the method according to the present invention.

FIG. 2 shows a flow chart which outlines in broad terms the mode of operation of arrangement 7 according to FIG. 1. If it has been determined in excitation device 5 that an impedance, which falls according to amount and phase into a predefined excitation polygon, has occurred in at least one loop of the polyphase power supply network to be monitored, then in a first step 21, it is initially checked whether a ground fault has occurred. If this is the case, then in a further testing step 22, an amount comparison is carried out. During this amount comparison, only the impedance of the phase-to-ground loops—detected by excitation device 5—are compared to the respective virtual impedance $Z_{VLxE}$.

The respective virtual impedance $Z_{VLxE}$ of the phase-to-ground loops detected by excitation device 5 is determined, without consideration of the zero current, using the conductor current $I_{Lx}$ in the phase-to-ground loop to be checked, according to the following equation (1)

$$Z_{VLXE} = \frac{1}{2} \cdot \frac{U_{LX-E}}{I_{LX}} \qquad (1)$$

In this equation, the variable $Z_{VLxE}$ designates the virtual impedance of a loop between a conductor Lx, x may be a value from 1 to 3, and ground; $U_{Lx-E}$ designates the voltage between the conductor of the respective checked phase-to-ground loop and ground, while $I_{Lx}$ designates the conductor current in the corresponding conductor Lx.

If the amounts of the impedances of phase-to-ground loops detected by excitation device 5 exceed a threshold value, which may be a k-fold magnitude of the amount (e.g. 1.5-fold) of the smallest virtual impedance in each case, then the relevant excitation is reset. The corresponding phase-to-ground loop is thus eliminated and is then considered as not excited.

Following is a further check of the loops still existing as faulty in the testing process, the check being carried out as a function of the number of loops originally recognized by excitation device 5 as excited simultaneously. Regarded as a criterion for this are the signals emitted by device 5 via data bus 6. If, on the basis of an excitation pattern thus produced by excitation device 5, it comes to light that in the present case, only one phase-to-ground loop has been excited, then a testing path 23 is the direction in which to continue for further checking, while in response to an excitation pattern having two excited phase-to-ground loops, a different testing path 24 is taken; if the excitation pattern shows that three phase-to-ground loops have been excited simultaneously, then testing path 25 is the direction in which to continue.

It is checked in testing path 23, in a functional block 26, whether one of the phase-to-phase loops transmitted by excitation device 5, or the detected one phase-to-ground loop, is to be classified as actually faulty. Accordingly, an appropriate signal is given by arrangement 7 according to FIG. 1, via data bus 9, to selector module 10.

In testing path 24, there is a functional block 27, by which it is determined whether, in the case of two simultaneously excited phase-to-ground loops, phase-to-ground loops or phase-to-phase loops are to be further treated as actually excited.

In testing path 25, there is a functional block 28, in which a check is always carried out for apparent impedance excitations when either the ground-fault recognition in method step 21 has yielded no ground fault, or when—as just explained—three phase-to-ground loops have been recognized by excitation device 5 as simultaneously excited. Also when functional blocks 26 and 27 furnish no unequivocal results, functional block 28 is additionally traversed, so that after running through the method of the present invention according to FIG. 2, at the conclusion, only those loop-indicating signals which designate actually faulty loops are emitted to selector module 10 according to FIG. 1.

Figure 3A:
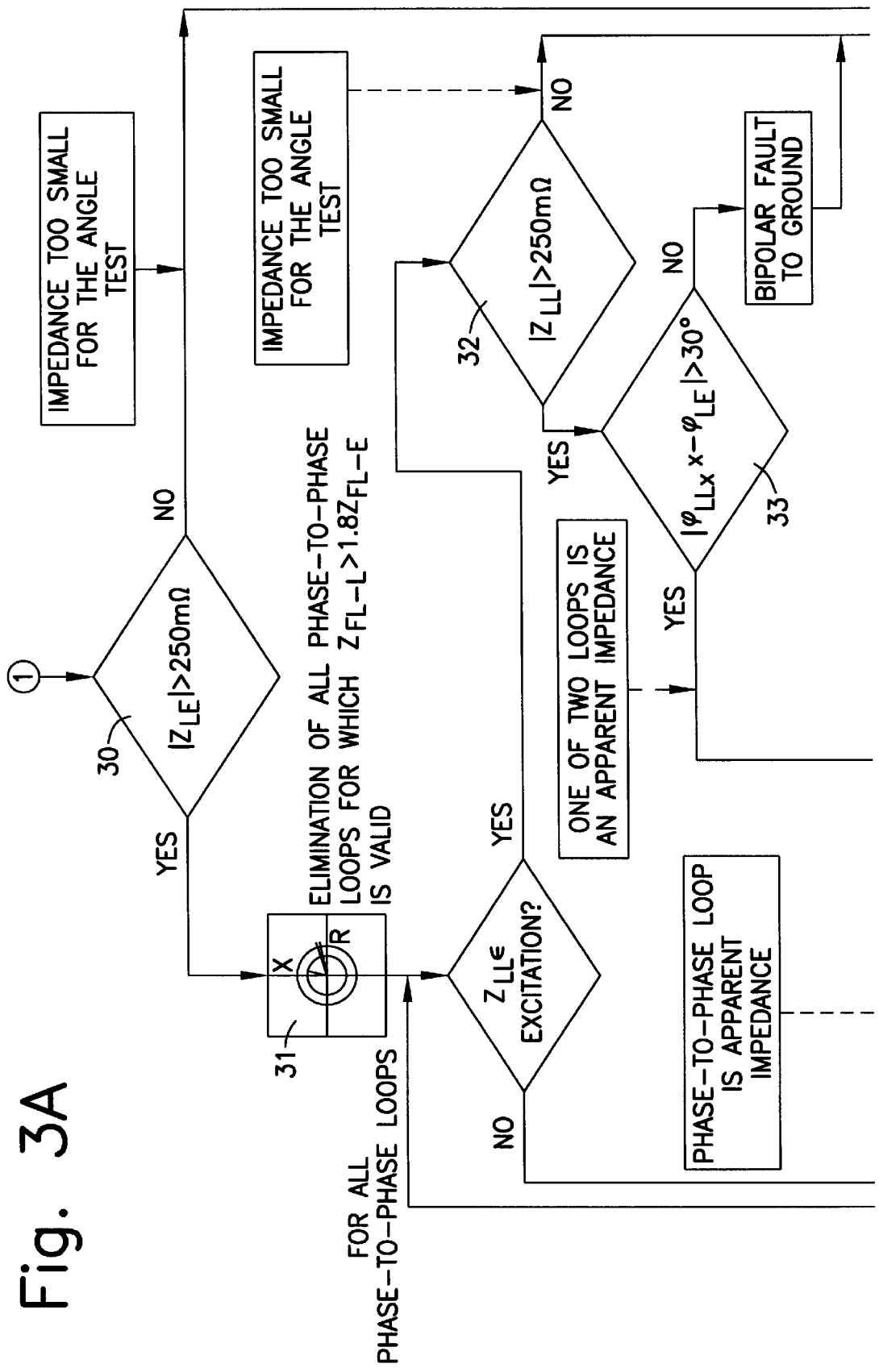
FIG. 3 shows a flow chart illustrating a sequence of the method in the case of a single excited phase-to-ground loop.
Figure 3B:
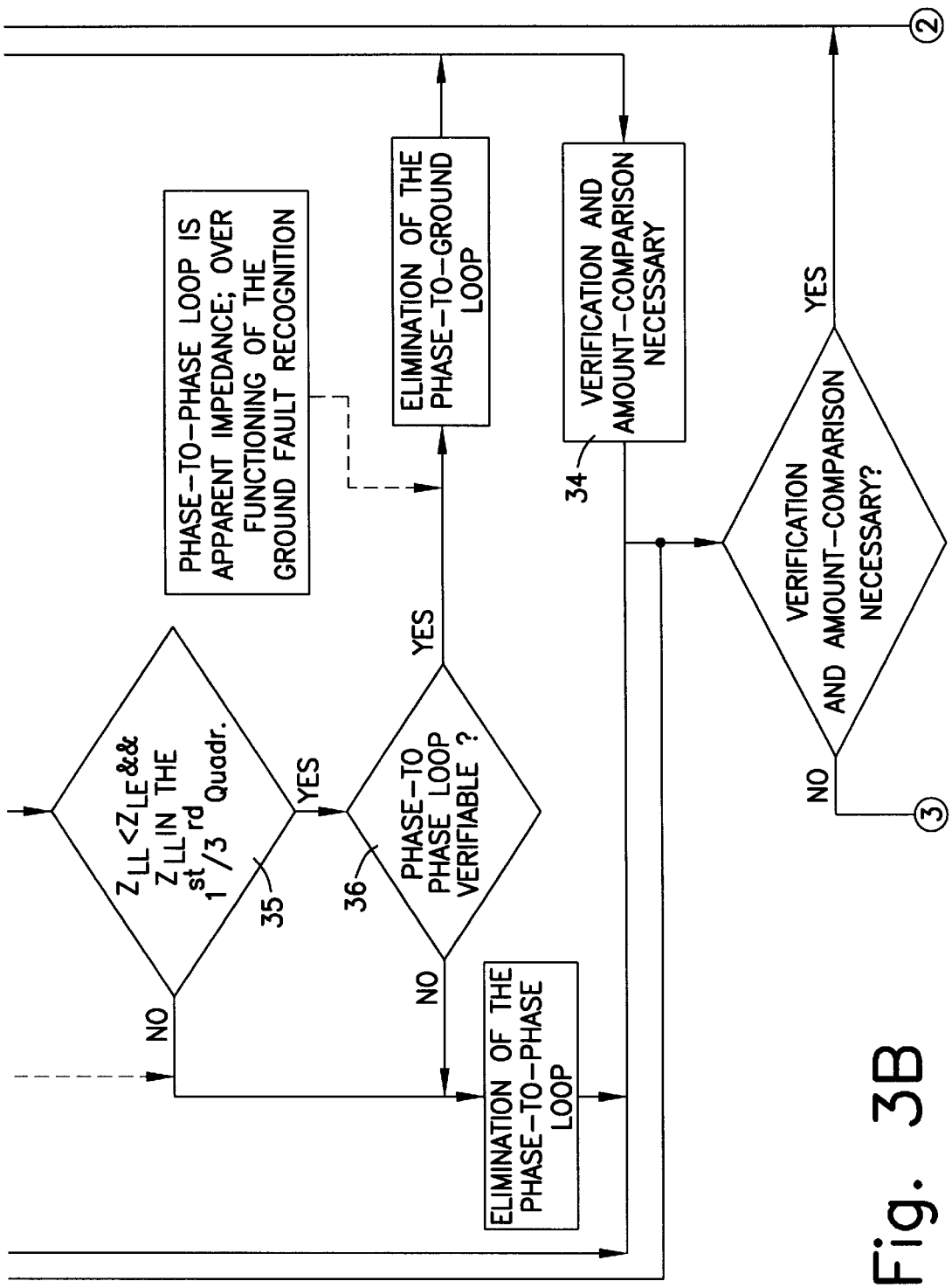

FIG. 3 shows functional block 26 according to FIG. 2 in detail, the correlation of FIG. 3 to FIG. 2 being indicated by the encircled numerals. The flow chart in FIG. 3 shows that, in a step 30, it is first checked whether the amount of the impedance of the respective phase-to-ground loop is greater than a predefined limiting value, in the present case 250 mΩ. With these means, too large a measuring error is prevented which, given impedance amounts that are too small, would result during the subsequent phase-angle measurement of the loop impedances.

After the step, or rather the branching 30 having the impedance check just described, then in a further method step 31, all the applied phase-to-phase loops are subsequently eliminated whose impedance amount $Z_{FL-L}$ is greater by a specific factor $K_2$ than the amount of the smallest determined phase-to-ground impedance $Z_{FL-E}$; for example $K_{2\ can\ be}$ 1.8. At this point, a phase-angle test is conducted with the remaining phase-to-phase loops, if it has been ascertained in a further method step 32 that the amounts of the still remaining loop impedances are greater than 250 mΩ in the example. If this threshold interrogation fails in the case of a phase-to-phase loop, then a clear statement about the fault can no longer be made in the functional block shown in FIG. 3. A branch-off is then made to functional block 28 according to FIG. 2.

If the phase angles of the phase-to-phase impedance and of the one detected phase-to-ground impedance differ from each other by 30°, for example, as is checked in further method step 33, then it is assumed that one of the two excitations must be an apparent excitation. Which of the two loops actually has a fault at this point is determined in further method steps. If both phase angles are identical, then the initial assumption is a bipolar ground fault. To verify this, another check test is subsequently carried out in a functional block 34.

To ascertain which of the two loops is actually involved in the fault, within the scope of the further testing, then following step 33, the amounts of the loop impedances are compared to one another in step 35. If the amount of the phase-to-phase impedance is less than that of the phase-to-ground impedance, and if the indicator of the phase-to-phase impedance lies in the 1st or 3rd quadrant of the phasor diagram, then the phase-to-phase loop is not involved in the fault and can be eliminated. If these conditions are not fulfilled, then the phase-to ground loop may only be eliminated if, due to a comparison to the virtual impedances, the measured phase-to-phase impedance can be classified as actually faulty. In this case, it is a question of an excess functioning of the ground-fault recognition. If the phase-to-ground loop has been eliminated, then, after processing by the functional block according to FIG. 3, functional block 28 according to FIG. 2 must likewise be traversed. If the impedance of the phase-to-phase loop cannot be recognized as actually faulty, then this impedance must be an apparent impedance and the corresponding phase-to-phase loop is eliminated.

In step 36, following step 35, of the check test of the phase-to-phase impedance, i.e. verification of the phase-to-phase loop, the assumption is that the conductor currents of both conductors, actually or supposedly involved in the fault, are identical to the fault current. Under this assumption, two virtual loop impedances can be calculated for a phase-to-phase loop. Only one conductor current is used in each case to calculate a virtual impedance; the calculation is carried out according to the following equations (2) and (3)

$$Z_{V1,LX-LY} = \frac{1}{2} \cdot \frac{U_{LX-LY}}{I_{LX}} \qquad (2)$$

$$Z_{V2,LX-LY} = \frac{1}{2} \cdot \frac{U_{LX-LY}}{I_{LY}} \qquad (3)$$

in which $Z_{V1,Lx-Ly}$ designates the virtual impedance of the respective phase-to-phase loop when calculating with current $I_{Lx}$ through the first conductor involved in the fault, and $Z_{V2,Lx-Ly}$ designates the virtual impedance when calculating with current $I_{Ly}$ through the second conductor involved in the fault; $U_{Lx-Ly}$ in equations (2) and (3) designates the voltages between the two conductors of the respective loop. If the two virtual impedances calculated in this manner do not deviate substantially from one another, and if these two loop impedances, normalized to the positive phase-sequence system impedance according to the theory of symmetrical components, are not substantially greater than the impedance calculated by device 3 according to FIG. 1, then with certainty it is not an apparent impedance. If the amount of the positive phase-sequence system impedance is less than, for example, 0.3 times the amount of the virtual impedances, then the loop impedance cannot be verified. From this, it follows that the corresponding phase-to-phase loop cannot be involved in the fault; it is eliminated when resistance and reactance have the same (plus or minus) sign.

Figure 4A:
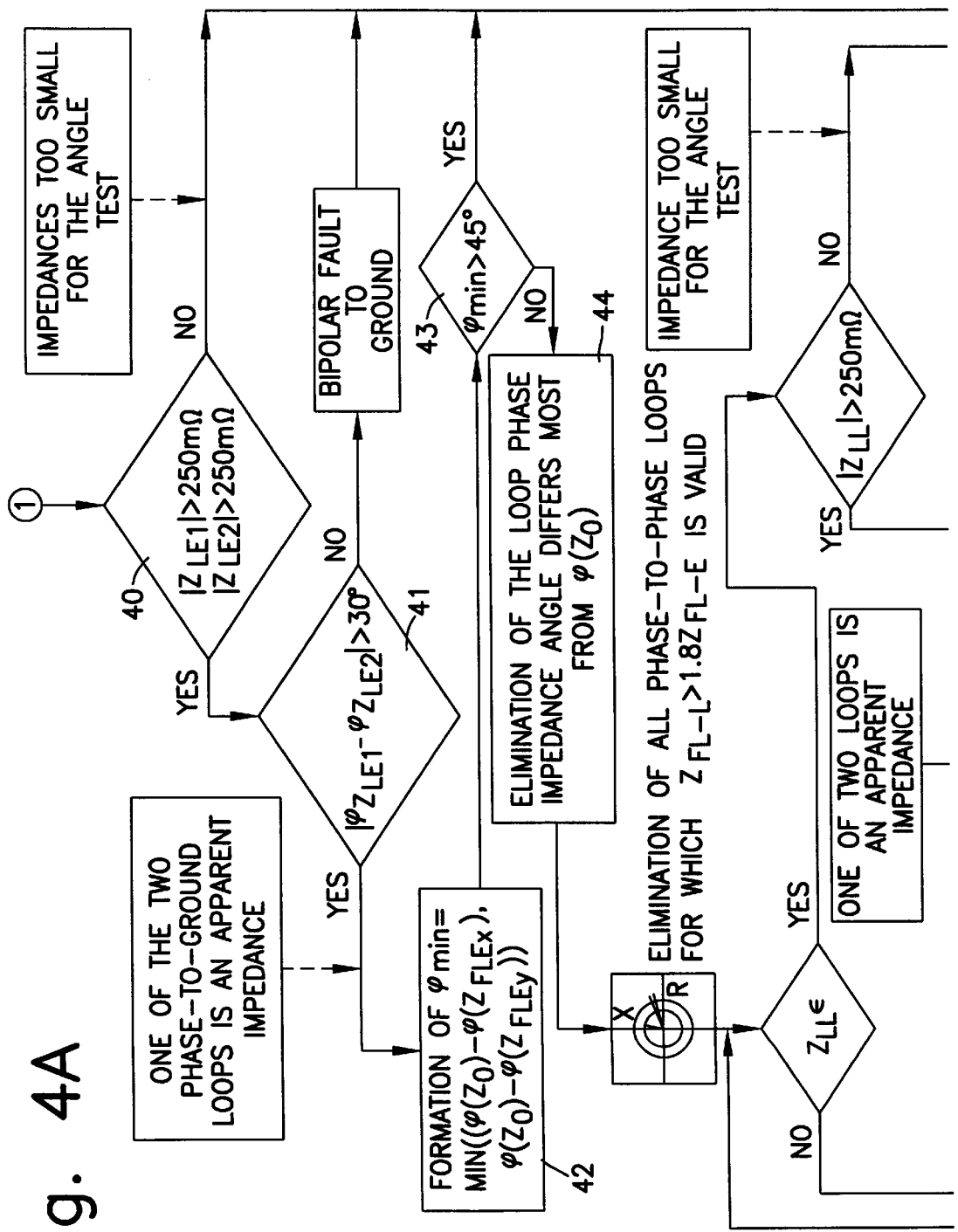
FIG. 4 shows a flow chart illustrating a sequence of the method in the case of two excited phase-to-ground loops.
Figure 4B:
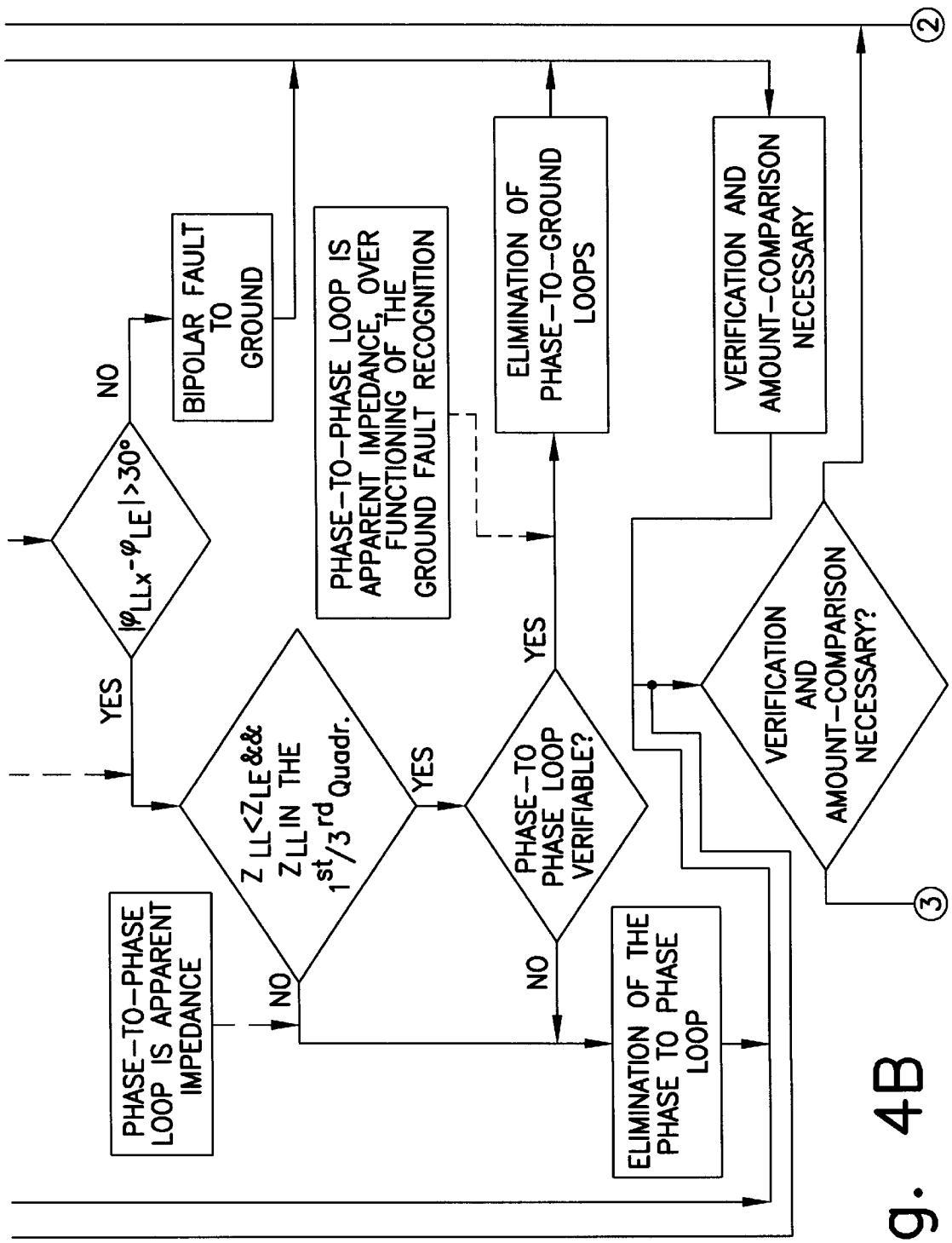

FIG. 4 shows functional block 27 according to FIG. 2 in its individual method steps. It can be seen that, in a first step 40, it is first checked whether the impedances of both excited phase-to-ground loops are great enough for a comparison of the phase angles. If this is not the case, then functional block 28 according to FIG. 2 is traversed.

Otherwise, in a further method step 41, it is subsequently checked whether the fault in the case of the two applied phase-to-ground loops is a bipolar ground fault. This is decided by comparing the phase angles of the two phase-to-ground loops to one another. If a difference of less than 30° results, then it may be a bipolar short-circuit to ground; a further check test is then carried out in functional block 28 according to FIG. 2. Otherwise, one of the two phase-to-ground loops is not faulty, and one of the two loops must be eliminated. This decision is made in the following steps 42 and 42, in view of the zero-sequence impedance.

The zero-sequence impedance is calculated according to the following equation (4)

$$Z_0 = \frac{U_0}{I_E} \quad (4)$$

in which $Z_0$ designates the zero-sequence impedance, $U_0$ designates the voltage to ground and $I_E$ indicates the ground current. In this context, the phase angle of the zero-sequence impedance is of primary importance, and therefore it is calculated. Subsequently, the differences between the phase angle of the two phase-to-ground impedances and the phase angle of the zero-sequence impedance is formed in method step 42. Only the smallest phase angle $\psi_{min}$ between the phase angle of the zero-sequence impedance and the phase angles of the impedances of the phase-to-ground loop $Z_{FL-E}$ is taken into account. If the smallest angle difference is greater than 45°, for example, then no clear statement can be made about which of the two phase-to-ground loops is not involved in the fault. The check according to functional block 28 in FIG. 2 is then carried out immediately. Otherwise, the phase-to-ground loop whose impedance angle differs the most from the phase angle of the zero-sequence impedance is eliminated in method step 44.

Further apparent excitation impedances are subsequently eliminated in the manner as set forth in detail in the explanation of FIG. 3, and specifically beginning with from method step 31 on.

Figure 5:
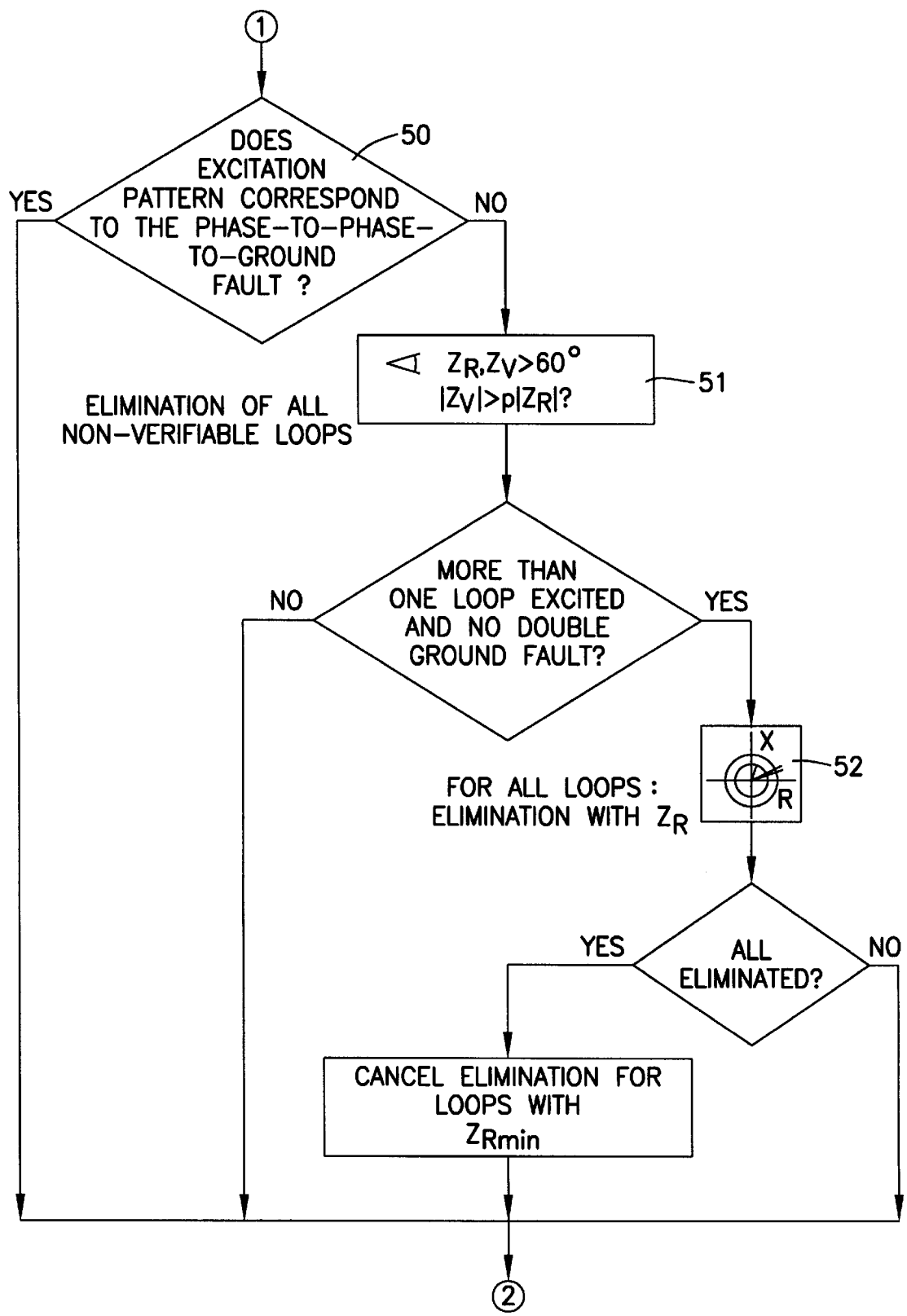
FIG. 5 shows a flow chart illustrating a sequence of the method in the case of three excited phase-to-ground loops or in the case of excited phase-to-phase loops that are exclusively free of ground faults.

In block 28, shown in detail in FIG. 5, a check test is performed when no phase-to-ground loop at all is reported as excited by device 5, or when all three phase-to-ground loops have been determined as faulty; furthermore—as already explained above in connection with FIGS. 3 and 4—functional block 28 according to FIG. 2 is always traversed when it was not possible to make an unequivocal statement in functional blocks 26 and 27 about the actually faulty loop in each case. If faults were already clearly recognized in functional blocks 26 and 27 as bipolar faults, then functional block 28 is passed over.

As shown in FIG. 5, in a first testing step 50, it is checked whether the excitation pattern, produced by excitation device 5 according to FIG. 1, corresponds to a phase-to-phase-to-ground fault; if this is the case, then a bipolar ground fault is verified. Otherwise, in the testing path according to FIG. 5, in a further testing step 51, all the loops still excited are verified with the aid of virtual impedances, and specifically in the following manner:

To eliminate phase-to-ground loops, it is assumed that the conductor current of the faulty conductor and the zero current are identical to the fault current. Given this assumption, two virtual loop impedances can be calculated for each phase-to-ground loop; the first time, a virtual impedance $Z_{V1,Lx-E}$ is calculated from zero current $I_E$ and the associated phase-to-ground voltage $U_{Lx-E}$, and another time, a further virtual impedance $Z_{V2,Lx-E}$ is calculated from conductor current $I_{Lx}$ and the associated phase-to-ground voltage $U_{Lx-E}$:

$$Z_{V1,LX-E} = \frac{1}{2} \cdot \frac{U_{LX-E}}{I_E} \quad (5)$$

$$Z_{V2,LX-E} = \frac{1}{2} \cdot \frac{U_{LX-E}}{I_{LX}} \quad (6)$$

If these virtual loop impedances are not substantially greater than the (positive phase-sequence system) impedance $Z_{Lx-E}$ —for reasons of space, designated by $Z_R$ in FIG. 5—calculated by excitation device 5, then with certainty it is not an apparent excitation in this case.

In detail, this comparison is performed by comparing the amounts of the impedances in conjunction with an angle comparison, as indicated in FIG. 5 and described in detail in the following equations (7) and (8):

$$\left(\left|\frac{U_{LX-E}}{I_{LX}}\right| \cdot \frac{3}{2+\frac{Z_0}{Z_1}} > 1.5|Z_{LX-E}|\right) \cap \left(\arg\frac{U_{LX-E}}{I_{LX}} - \arg Z_{LX-E} < 60°\right) \quad (7)$$

and $$\left(\left|\frac{U_{LX-E}}{I_E}\right| \cdot \frac{3}{2+\frac{Z_0}{Z_1}} > 1.5|Z_{LX-E}|\right) \cap \left(\arg\frac{U_{LX-E}}{I_E} - \arg Z_{LX-E} < 60°\right) \quad (8)$$

In these equations (7) and (8), $Z_0$ designates the zero-sequence impedance and $Z_1$ designates the positive phase-sequence system impedance of the line; these impedances are not formed from measurable quantities, but rather describe properties of the line; and 1.5 is a freely predefined factor which is designated by p in FIG. 5. Utilized by equations (7) and (8) is the fact that, when fault-free loops are present, an impedance indicator formed with loop current $I_{Lx}$ deviates perceptibly, according to amount and phase position, from an indicator formed only with the phase current. In contrast to that, the indicators of faulty loops are nearly congruent. However, the angle comparison is only performed if the amounts of the virtual impedance and the positive phase-sequence system impedance do not differ too strongly from one another (e.g., by a factor of 1.5). Without an angle check, the respective loop is evaluated as not verifiable in this step 51.

In the case of multiple ground faults having different base points in a direction from the mounting location of a protective device operating according to the method of the present invention, no clear differentiation of fault impedances and apparent impedances is possible in principle with the aid of this verification of the excitation. For this reason, in a further testing step 52, an apparent-impedance elimination is subsequently carried out by an amount comparison.

To eliminate phase-to-phase loops, the excitation is verified in view of the phase, angles by taking into account the following equations (9) and (10):

$$\left(\left|\frac{U_{LX-LY}}{I_{LX}}\right| \cdot \frac{1}{2} > 1.2|Z_{LX-LY}|\right) \cap \left(\arg\frac{U_{LX-LY}}{I_{LX}} - \arg Z_{LX-LY} < 60°\right) \quad (9)$$

and

-continued $$\left(\left|\frac{U_{LX-LY}}{I_{LY}}\right|\cdot\frac{1}{2} > 1.2|Z_{LX-LY}|\right) \cap \left(\arg\frac{U_{LX-LY}}{I_{LY}} - \arg Z_{LX-LY} < 60°\right) \quad (10)$$

In these equations (9) and (10), $U_{Lx-Ly}/I_{Lx}$ designates a first virtual impedance of the phase-to-phase loop affected in each case, and $U_{Lx-Ly}/I_{Ly}$ designates a further virtual impedance of the same phase-to-phase loop in each case; $Z_{Lx-Ly}$ is the respective positive phase-sequence system impedance; 1.2 is a freely predefined factor which is designated by p in FIG. 5. In the case of multiple faults having different base points in a direction from the mounting location of the protective device, no clear differentiation of fault impedances and apparent impedances is possible in principle with the aid of this verification of the excitation.

Thus here, as well, the first step of the verification consists of a comparison of the amounts of the positive phase-sequence system impedance and of the virtual impedance. If the amounts of the virtual impedance and the positive phase-sequence system impedance differ too strongly from one another (e.g., by a factor of 1.2), then no angle test is conducted; and the appropriate loop cannot be verified.

If the amounts of virtual and positive phase-sequence system impedance, both in the case of phase-to-ground loops and in the case of phase-to-phase loops, are not unacceptably different, then the angle comparison is carried out between the positive phase-sequence system impedance and the two virtual impedances. In this case, the respective angle comparison is only performed when the impedance is great enough for a sufficiently precise angle determination. During the angle test, all loops are confirmed where the difference between the phase angle of the positive phase-sequence system impedance and the phase angle of the virtual impedance is less than 60°.

If the amount comparison and the angle test have proceeded positively with the first virtual impedance, then the same tests are conducted once again with the second virtual impedance.

If the impedance of a loop cannot be verified, this loop is only eliminated from the excitation pattern when the positive phase-sequence system impedance is in the 2nd or 4th quadrant of the complex plane.

If, at this point, still more than one loop is excited, and if no double ground fault has yet been recognized, then the apparent-excitation elimination is carried out for all loops by an amount comparison of the positive phase-sequence system impedances in step 52. As in step 22 according to FIG. 2, factor k may be, for example 1.5. The additional amount comparison is necessary, since not all types of faults can be clearly recognized during the verification of the excitation.

Finally, it is checked for certainty whether all excited loops were eliminated. If this is the case, then the last elimination with the amount comparison is canceled.

What is claimed is:

1. A method for identifying a faulty loop in a polyphase electrical power supply network, the polyphase electrical power supply network including a plurality loops, comprising the steps of:

performing an impedance excitation process on each of the plurality of loops; and performing at least one of i) determining only loops of the plurality of loops which are fault-free, and ii) determining at least one loop of the plurality of loops as faulty, the step of determining only loops of the plurality of loops which are fault-free including the steps of detecting at least one phase-to-phase loop within the plurality of loops, for each detected phase-to-phase loop, determining during the impedance excitation process a respective first excitation impedance, determining a respective first virtual impedance for each detected phase-to-phase loop, for each detected phase-to-phase loop, comparing a magnitude and a phase of the respective first virtual impedance to a magnitude and a phase of the respective first excitation impedance, and for each detected phase-to-phase loop, if the magnitude of the respective first virtual impedance is greater than the magnitude of the respective first excitation impedance, and a difference between the phase of the respective virtual impedance and the phase of the respective first excitation impedance is smaller than a first preselected angle, identifying the detected phase-to-phase loop as faulty, and the step of determining the at least one loop of the plurality of loops as faulty including the steps of detecting a plurality of phase-to-ground loops within the plurality of loops, determining a plurality of respective second virtual impedances for the plurality of detected phase-to-ground loops, for each of the plurality of detected phase-to-ground loops, determining during the impedance excitation process a respective second impedance, for each of the plurality of detected phase-to-ground loops, comparing a magnitude of the respective second impedance to a magnitude of a smallest virtual impedance of the plurality of respective second virtual impedances, and for each of the plurality of detected phase-to-ground loops, identifying the detected phase-to-ground loop as fault-free if the magnitude of the respective second impedance is greater than the magnitude of the smallest virtual impedance of the plurality of respective second virtual impedances by a preselected amount.

2. The method according to claim 1, further comprising the step of:

if a number of the plurality of detected phase-to-ground loops is two, performing the steps of comparing the phase of each respective second impedance to each other, and if a difference between the phase of each respective second impedance is greater than a second preselected angle, performing the steps of comparing the phase of each respective second impedance to a phase of a zero-sequence impedance, identifying a first one of the plurality of detected phase-to-ground loops as fault-free if a difference between the phase of the respective second impedance of the first one of the plurality of detected phase-to-ground loops and the phase of the zero-sequence impedance is greater than a difference between the phase of the respective second impedance of a second one of the plurality of detected phase-to-ground loops and the phase of the zero-sequence impedance, for each detected phase-to-phase loop, comparing the respective first excitation impedance to a smallest one of i) the respective second impedance of the first one of the plurality of detected phaseto-ground loops, and ii) the respective second impedance of the second one of the plurality of detected phase-to-ground loops, for each detected phase-to-phase loop, if the respective first excitation impedance is larger than a multiple of the smallest one, identifying the detected phase-to-phase loop as fault-free, and for each detected phase-to-phase loop not identified as fault-free, performing the step of if the difference between the phase of the respective first excitation impedance is larger than a phase of the smallest one by greater than a second predefined angle, and the magnitude of the respective first excitation impedance is greater than a magnitude of the smallest one, and a phasor representing the respective first excitation impedance is in one of a first quadrant and a third quadrant of a phasor diagram, identifying the detected phase-to-phase loop as fault-free.

3. The method according to claim 2, further comprising the step of:

for each of the detected phase-to-ground loops and before the step of comparing the phase of each respective second impedance to each other, comparing the magnitude of the respective second impedance to a second preselected threshold value.

4. The method according to claim 1, further comprising the steps of:

if a number of the plurality of detected phase-to-ground loops identified as faulty is three, performing the steps of for each of the plurality of phase-to-phase loops, if a difference between the respective first excitation impedance and the respective first virtual impedance is greater than a preselected amount, identifying the phase-to-phase loop as fault-free, and for each of the plurality of phase-to-ground loops, if a difference between the respective second impedance and the respective second virtual impedance is greater than the preselected amount, identifying the phase-to-ground loop as fault-free.

5. The method according to claim 1, wherein positive phase-sequence system impedances calculated according to a theory of symmetrical components are used to compare the magnitude of the respective first excitation impedance of each detected phase-to-phase loop.

6. A method for identifying a faulty loop in a polyphase electrical power supply network, the polyphase electrical power supply network including a plurality loops, comprising the steps of:

performing an impedance excitation process on each of the plurality of loops;

determining only loops of the plurality of loops which are fault-free including the steps of detecting at least one phase-to-phase loop within the plurality of loops, for each detected phase-to-phase loop, determining during the impedance excitation process a respective first excitation impedance, determining a respective first virtual impedance for each detected phase-to-phase loop, for each detected phase-to-phase loop, comparing a magnitude and a phase of each respective first virtual impedance to a magnitude and a phase of each respective first excitation impedance, and for each detected phase-to-phase loop, if the magnitude of the respective first virtual impedance is greater than the magnitude of the respective first excitation impedance, and a difference between the phase of the respective virtual impedance and the phase of the respective first excitation impedance is smaller than a first preselected angle, identifying the detected phase-to-phase loop as faulty; and determining at least one loop of the plurality of loops as faulty, including the steps of detecting a single phase-to-ground loop within the plurality of loops;

determining during the impedance excitation process a second impedance of the detected phase-to-ground loop;

for each detected phase-to-phase loop, comparing the magnitude of the respective first excitation impedance to a preselected multiple of a magnitude of the second impedance, for each detected phase-to-phase loop, if the magnitude of the respective first excitation impedance is greater than the preselected multiple of the magnitude of the second impedance, identifying the phase-to-phase loop as fault-free, and for each detected phase-to-phase loop, if the magnitude of the respective first excitation impedance is not greater than the preselected multiple of the magnitude of the second impedance, performing the steps of comparing the phase of the respective first excitation impedance to a phase of the second impedance, and if a difference between the phase of the respective first excitation impedance and the phase of the second impedance is greater than a second preselected angle, and the magnitude of the respective first excitation impedance is less than the magnitude of the second impedance, and a phasor representing the respective first excitation impedance is in one of a first quadrant and a third quadrant of a phasor diagram, identifying the detected phase-to-phase loop as fault-free.

7. A method for identifying a faulty loop in a polyphase electrical power supply network, the polyphase electrical power supply network including a plurality loops, comprising the steps of:

performing an impedance excitation process on each of the plurality of loops;

determining only loops of the plurality of loops which are fault-free, including the steps of:

detecting at least one phase-to-phase loop within the plurality of loops, for each detected phase-to-phase loop, determining during the impedance excitation process a respective first excitation impedance, detecting a phase-to-ground loop within the plurality of loops, determining during the impedance excitation process a second impedance of the phase-to-ground loop, determining a respective first virtual impedance for each detected phase-to-phase loop, for each detected phase-to-phase loop, comparing a magnitude of the respective first excitation impedance to a first preselected threshold value, and for each detected phase-to-phase loop, if the magnitude of the respective first excitation impedance is greater than the first preselected threshold value, performing the steps of comparing a magnitude and a phase of the respective first virtual impedance to the magnitude and a phase of the respective first excitation impedance, and if the magnitude of the respective first virtual impedance is greater than the magnitude of the respective first excitation impedance, and a difference between the phase of the respective virtual impedance and the phase of the respective first excitation impedance is smaller that a first preselected angle, identifying the detected phase-to-phase loop as faulty, and;

determining at least one second loop of the plurality of loops as faulty, including the steps of:

for each detected phase-to-phase loop, if the magnitude of the respective first excitation impedance is greater than the first preselected threshold value, performing the steps of comparing the magnitude of the respective first excitation impedance to a preselected multiple of a magnitude of the second impedance, if the magnitude of the respective first excitation impedance is greater than the preselected multiple of the magnitude of the second impedance, identifying the phase-to-phase loop as fault-free, and if the magnitude of the respective first excitation impedance is not greater than the preselected multiple of the magnitude of the second impedance, performing the steps of comparing the phase of the respective first excitation impedance to a phase of the second impedance, and if a difference between the phase of the respective first excitation impedance and the phase of the second impedance is greater that a second preselected angle, and the magnitude of the respective first excitation impedance is less than the magnitude of the second impedance, and a phasor representing the respective first excitation impedance is in one of a first quadrant and a third quadrant of a phasor diagram, identifying detected phase-to-phase loop as fault-free.

8. The method according to claim 6, further comprising the steps of:

for each detected phase-to-phase loop, if a difference between the phase of the respective first excitation impedance and the phase of the second impedance is greater than a third preselected angle, and if the magnitude of the respective first excitation impedance is greater than the magnitude of the second impedance, identifying the phase-to-phase loop as fault-free; and for each detected phase-to-phase loop, if the magnitude of the respective first excitation impedance is not greater than the magnitude of the second impedance and is less than a value of a positive phase-sequence system impedance calculated according to a theory components, identifying the detected phase-to-ground loop as fault-free.

* * * * *